(12) United States Patent
Müllinger-Bausch et al.

(10) Patent No.: US 11,870,169 B2
(45) Date of Patent: Jan. 9, 2024

(54) EDGE CONNECTOR AND PRINTED CIRCUIT BOARD ASSEMBLY

(71) Applicant: IMS CONNECTOR SYSTEMS GMBH, Löffingen (DE)

(72) Inventors: Christoph Müllinger-Bausch, Titisee-Neustadt (DE); Roland Baumgärtner, Bonndorf-Wellendingen (DE); Michael Regenbrecht, Wermelskirchen (DE)

(73) Assignee: IMS CONNECTOR SYSTEMS GMBH, Loffingen (DE)

( * ) Notice: Subject to any disclaimer, the term of this patent is extended or adjusted under 35 U.S.C. 154(b) by 545 days.

(21) Appl. No.: 17/262,967

(22) PCT Filed: Jul. 26, 2019

(86) PCT No.: PCT/EP2019/070235
§ 371 (c)(1),
(2) Date: Jan. 25, 2021

(87) PCT Pub. No.: WO2020/021091
PCT Pub. Date: Jan. 30, 2020

(65) Prior Publication Data
US 2021/0226369 A1    Jul. 22, 2021

(30) Foreign Application Priority Data

Jul. 27, 2018  (DE) .......................... 102018118224.4
Jul. 27, 2018  (DE) .......................... 202018106554.8

(51) Int. Cl.
*H01R 12/72*  (2011.01)
*H05K 1/18*  (2006.01)

(52) U.S. Cl.
CPC ............. *H01R 12/721* (2013.01); *H05K 1/18* (2013.01); *H05K 2201/09754* (2013.01); *H05K 2201/10189* (2013.01)

(58) Field of Classification Search
None
See application file for complete search history.

(56) References Cited

U.S. PATENT DOCUMENTS 6,224,421 B1 *  5/2001  Maturo, Jr. ........ H01R 13/6315
                                                            439/247
9,502,825 B2 *  11/2016  Weinstein .......... H01R 13/6461
(Continued)

FOREIGN PATENT DOCUMENTS

DE     69103652 T2    1/1995
DE     69205131 T2    5/1996
(Continued)

OTHER PUBLICATIONS

"Automotive Connector System up to 15 GHz / 20 Gbps HFM—High-Spee FAKRA-Mini" Rosenberger Hochfrequenztechnik Gmbh & Co. KG, Hauptstrasse 1, 83413 Fridolging, Germany, 2017.
(Continued)

*Primary Examiner* — Xanthia C Relford
(74) *Attorney, Agent, or Firm* — Nath, Goldberg & Meyer; Jerald L. Meyer

(57) ABSTRACT

The present invention relates to an edge connector (1) for a printed circuit board (50), comprising an at least two-part housing (10) with a first housing part (20) and a second housing part (30), wherein the first housing part (20) has a recess (25) in which at least one conductor (15) is arranged, said at least one conductor (15) having a first limb (16) with a first end (17) and a second limb (18) with a second end (19), wherein the housing (10) comprises a first region (12) in a first plane (11), in which each first end (17) protrudes out of the housing (10) in an assembly direction (5) in order to
(Continued)

Figure 1:
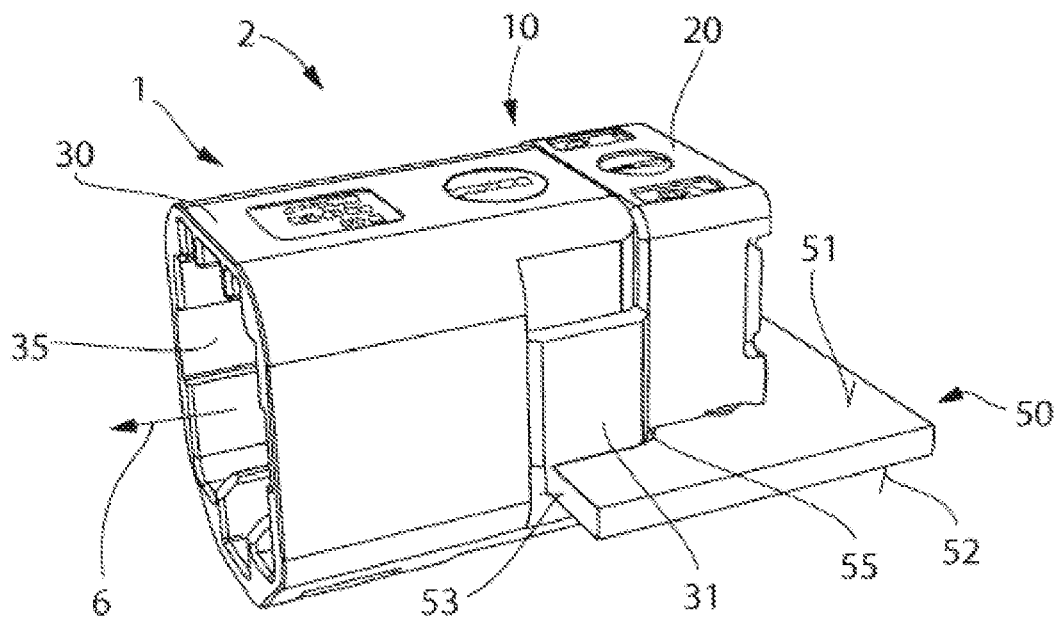

connect to a conductor track (54) of the printed circuit board (50), and the housing (10) has a second region (14) in a second plane (13) which is arranged parallel and at a distance to the first plane (11) in the assembly direction (5), wherein the second limb (18) is arranged at an angle of 90° to the first limb (16), and the second limb (18) protrudes into a mating plug recess (35) in the second housing part (30) in a plug-in direction (6). The present invention additionally relates to a printed circuit board assembly (2) with at least one such edge connector.

17 Claims, 1 Drawing Sheet

(56) References Cited

U.S. PATENT DOCUMENTS

| | | | |
|---|---|---|---|
| 2004/0121625 A1 | 6/2004 | Togashi | |
| 2005/0221631 A1 | 10/2005 | Yamaguchi | |
| 2011/0021080 A1* | 1/2011 | Kamiya | H01R 12/778 |
| | | | 29/874 |
| 2011/0039423 A1 | 2/2011 | Blasick et al. | |
| 2012/0094540 A1* | 4/2012 | Yasui | H01R 12/737 |
| | | | 439/627 |
| 2013/0017702 A1* | 1/2013 | Kamiya | H01R 12/89 |
| | | | 439/345 |
| 2014/0193995 A1* | 7/2014 | Barthelmes | H01R 12/91 |
| | | | 439/374 |

FOREIGN PATENT DOCUMENTS

| | | |
|---|---|---|
| DE | 69302496 T2 | 12/1996 |
| DE | 69901084 T2 | 10/2002 |
| DE | 102015122868 A1 | 6/2017 |
| WO | 96/17410 A1 | 6/1996 |
| WO | 2011/156314 A2 | 12/2011 |

OTHER PUBLICATIONS

Technical Data Sheet for HFM Right Angle Plug, AMS22D-40MZ5-Y.

German Office Action dated Mar. 11, 2019, in corresponding priority application No. 10 2018 118 224.4.

Office action in parallel pending Chinese patent application No. 201980049514.7 issued by the Chinese Patent Office dated Aug. 24, 2022.

\* cited by examiner

EDGE CONNECTOR AND PRINTED CIRCUIT BOARD ASSEMBLY

This is a National Phase Application filed under 35 U.S.C. 371 as a national stage of PCT/EP20019/070235, filed Jul. 26, 2019, an application claiming the benefits of German Application No. 10 2018 118 224.4, filed Jul. 27, 2018, and German Application No. 10 2018 106 554.8, filed Jul. 27, 2018, the content of each of which is hereby incorporated by reference in its entirety.

The present invention relates to an edge connector for a printed circuit board assembly with the features of claim 1 and to a printed circuit board assembly with the features of claim 16.

Edge connectors are known in various configurations from prior art and are also offered under the English name "edge mount connector". Edge connectors are typically arranged in the region of a side edge of a printed circuit board in order to electrically connect an electrical signal via the edge connector from a remote sensor or an antenna to a conductor track arranged in the printed circuit board in an electrically insulated manner. The signals are often high-frequency (HF) signals. To ensure interference-free transmission of the signals, the signals are transmitted using coaxial cables that are shielded from electrical and/or electromagnetic fields by an outer conductor that surrounds the signal-carrying conductor. Accordingly, the plug connectors known from prior art are typically designed as coaxial plug connectors, the outer housing of which forms an outer conductor, and a side edge encompasses the printed circuit board on the one hand for fastening and on the other hand is electrically connected to a further conductor track to enable a grounding for diverting the electrical and/or electromagnetic fields.

A disadvantage of this prior art has been shown to be that the edge connectors known from prior art only allow a conductor to be connected simultaneously. It has also proven to be disadvantageous that the direct contact between the conductor tracks and the plug connector means that repeated detaching and re-establishment of the plug-in connection leads to the destruction of the conductor tracks on the printed circuit board, and the assembly of the currently known edge connector is complex and can be attached to the printed circuit board only partially in an SMT process.

This is where the present invention starts.

It is the object of the present invention to provide an edge connector for a printed circuit board, which enables the simultaneous connection of at least one conductor, preferably a plurality of conductors, and has the lowest possible height, whereby the space available for a printed circuit board assembly is used as efficiently as possible. Furthermore, the edge connector should reduce the occurrence of passive intermodulation to the lowest possible level and guarantee the best possible shielding of the conductors against electrical and/or electromagnetic fields. In addition, the edge connector should be an SMD-compatible component that enables cost-effective and fully automated production of a printed circuit board assembly using conventional manufacturing processes.

These objects are achieved by an edge connector with the features of claim 1 and with a printed circuit board assembly with the features of claim 16.

The dependent claims specify further advantageous configurations of the edge connector and the printed circuit board assembly.

The edge connector according to the invention for a printed circuit board comprises at least one two-part housing with a first housing part and a second housing part, the first housing part having a recess in which at least one conductor is arranged.

According to the invention, the at least one conductor in the recess is designed to transmit a high-frequency electrical signal, in particular from an antenna. In addition, each at least one conductor comprises a first limb with a first end and a second limb with a second end, wherein the first end is set up to establish an electrical connection with a conductor track of the printed circuit board, and the second end is set up to establish an electrical connection with a corresponding electrical contact of a mating connector. The housing furthermore comprises a first region in a first plane in which the first end of each at least one conductor protrudes in an assembly direction from the housing for connection to a conductor track of the printed circuit board. In the first region, a bottom side of the housing is accordingly set up to rest on a top side of the printed circuit board in the first plane, with the first end of each conductor protruding from the first plane in the assembly direction, which end, for example, protrudes through a through hole in the printed circuit board for connection to the conductor track on a bottom side of the printed circuit board. In addition, the housing comprises a second region, which is formed in at least one second plane, which is arranged in the assembly direction parallel to and spaced from the first plane. In the second region, a bottom side of the housing is accordingly designed to protrude or pass through a slot machined into the printed circuit board. This enables a reduction in the total height of the printed circuit board assembly with an edge connector according to the invention. The second region of the housing accordingly penetrates the slot in the printed circuit board. Furthermore, it is provided according to the invention that the second limb is arranged at an angle, preferably of 90°, to the first limb and protrudes into a mating plug recess in a plug-in direction in the second housing part. Accordingly, the second end on the second limb of the at least one conductor stands freely in the connector recess and can establish an electrical connection with the mating connector through the corresponding contacts.

According to a further advantageous embodiment of the present invention, it is provided that the first housing part is firmly connected to the second housing part, and that the second housing part is made of a non-electrically conductive material, in particular a plastic. Such a configuration of the second housing part avoids metal-to-metal contacts within the housing of the edge connector according to the invention, whereby the occurrence of passive intermodulation (PMI) is reduced. The two housing parts can also for example be manufactured during an injection molding process, with the first housing part being particularly preferably made of an electrically conductive material, and the second housing part being made of a plastic, in particular an SMT-compatible material, which withstands the temperatures prevailing during the soldering of the electrical contacts.

It is also advantageous if the edge connector is designed as a multiple edge connector and has at least two conductors which are spaced apart from one another, and whose respective second limbs protrude into the mating plug recess of the second housing part. The at least two conductors are preferably spaced apart from one another in a direction perpendicular to the plug-in direction.

A further advantageous embodiment of the present invention provides that the at least two conductors of the multiple edge connector are arranged in at least two rows parallel to one another, wherein each row is further preferably arranged parallel to the first plane or parallel to the surface of the printed circuit board.

It is advantageous if the first housing part and/or the second housing part form a second region. Accordingly, the first housing part and the second housing part penetrate the slot in the printed circuit board, whereby on the one hand at least two conductors in the second region are shielded against electrical and/or electromagnetic fields by the first housing part, and on the other hand the first housing part is held galvanically isolated from the printed circuit board by the second housing part.

In particular, it is advantageous if the second housing part completely encloses the first housing part in the second region transversely to the plug-in direction. It is furthermore advantageous if the second housing part is held in a form-fitting manner on the first housing part, which results in a particularly simple assembly of the edge connector according to the invention in addition to the advantages explained above.

A further advantageous embodiment of the present invention provides that the recess in the first housing part in the plug-in direction has a through hole for each at least one conductor, through which the second limb of each at least one conductor is guided, and that in the through hole each at least one conductor is held on the first housing part by means of a dielectric. According to the present invention, it is particularly advantageous if only each at least one conductor is held in the through hole on the housing or the first housing part.

In addition, it has proven to be advantageous if an outer conductor is arranged around the second end of each at least one conductor in the manner of a coaxial connector. The outer conductor surrounds each at least one conductor in the form of a sleeve, each at least one conductor being held electrically insulated from the outer conductor coaxially to the outer conductor in the plug-in direction by a dielectric.

In particular, it is advantageous if the sleeve-shaped outer conductor is electrically connected to the first housing part. Through the first housing part, the at least one outer conductor of the at least one conductor can be jointly connected to ground, whereby a particularly simple construction of the edge connector according to the invention is realized.

Furthermore, it is advantageous if the at least one outer conductor of the at least one conductor is arranged in regions between the first plane and the second plane. The largest possible proportion of the at least one outer conductor is preferably located on the side of the first plane facing the second plane. According to an embodiment according to the invention, the proportion of the at least one outer conductor on the side of the first plane facing the second plane is approx. 50%, so that in this specific and preferred embodiment the at least one conductor of the associated outer conductor is arranged approximately in the first plane. As a result, the construction of the printed circuit board assembly according to the invention with at least one edge connector according to the invention is particularly compact.

Another advantageous embodiment of the present invention provides that the second housing part has at least one shoulder protruding in the first plane perpendicular to the plug-in direction, which shoulder is preferably set up to rest on the top side and/or the bottom side of the printed circuit board. The shoulder supports the housing of the edge connector on the printed circuit board and thus protects the electrical connections between the conductors and the conductor tracks of the printed circuit board from mechanical effects when plugging and unplugging the connector. The electrical connections between the conductors and the conductor tracks are typically formed as soldered connections.

Another advantageous embodiment of the present invention provides that the first limb of the at least one conductor stands freely in the recess of the first housing part. The recess is particularly preferably designed in such a way that the at least one conductor can be inserted into the recess in the plug-in direction, the second limb of each at least one conductor being guided through the through hole and then being fastened there by means of the dielectric and the sleeve-shaped outer conductor. In particular, it has proven to be advantageous if a third housing part is provided, which closes the recess of the first housing part. It is also preferred if the third housing part is made of an electrically conductive material, whereby the recess of the first housing part is shielded from electrical and/or electromagnetic fields.

Another aspect of the present invention relates to a printed circuit board assembly with at least one edge connector according to the invention, in particular a multiple edge connector. According to the present invention, it is provided that the printed circuit board comprises a slot inserted in an edge, and that the first region of the housing of the edge connector is arranged in the first plane on the printed circuit board, and that the second region of the housing protrudes into the slot.

According to a further preferred embodiment of the present invention, it is provided that the shoulders of the second housing part rest in the plug-in direction adjacent to the slot in the first plane on the printed circuit board, whereby the housing of the connector is supported on the printed circuit board in an electrically insulated manner.

Figure 2:
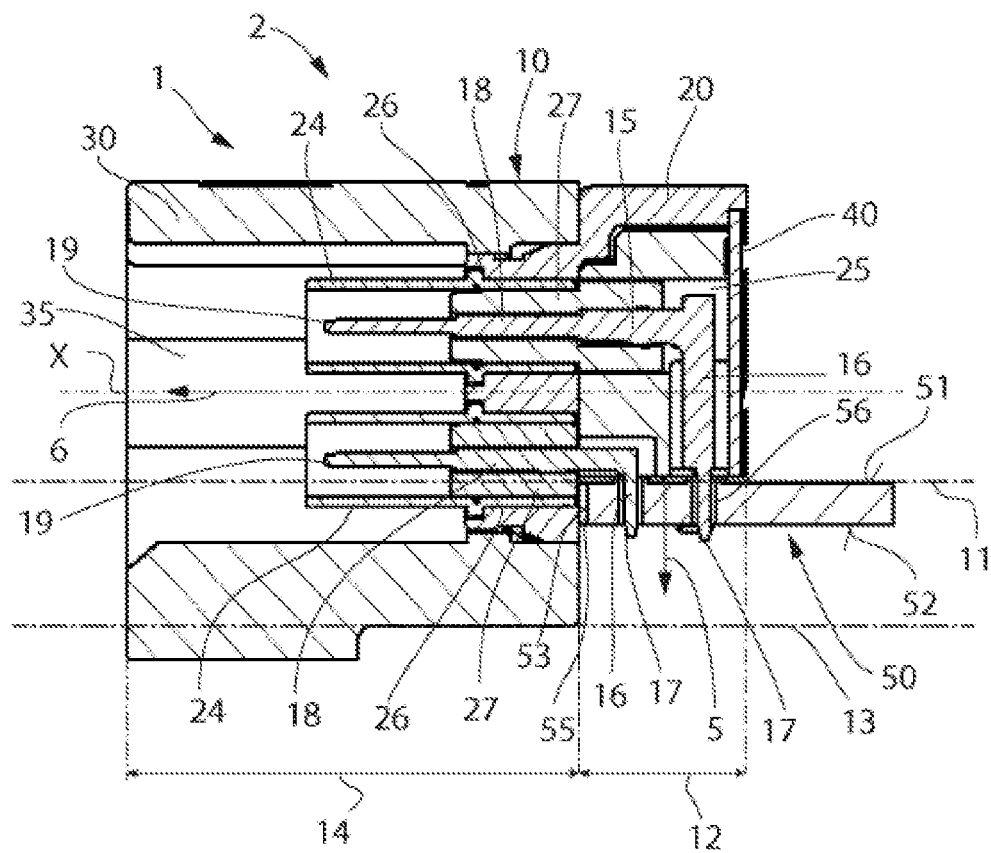

An exemplary embodiment of the present invention according to the invention is described below with reference to the accompanying drawings. In the drawings:

FIG. 1 shows a simplified perspective illustration of a printed circuit board assembly according to the invention with an edge connector having four conductors, and FIG. 2 shows a simplified partially sectioned illustration of the printed circuit board assembly according to FIG. 1.

FIG. 1 shows a printed circuit board assembly 2 comprising a printed circuit board 50 and an edge connector 1, which is designed as a multiple edge connector 1. In the Figures, for the sake of simplicity, the printed circuit board 50 is shown only in part, the printed circuit board 50 having a top side 51, a bottom side 52 and an edge 53 which connects the top side 51 to the bottom side 52 and extends around the entire circumference of the printed circuit board 50.

The printed circuit board 50 is made of an electrically non-conductive material and can have a multitude of conductor tracks 54 on the bottom side 52, which conductor tracks can be set up for electrical connections to electrical components (not shown) which are arranged, for example, on the top side 51 of the printed circuit board 50.

For establishing an electrical connection of the conductor tracks 54, in particular for establishing an electrical connection to electrical components arranged at a distance from the printed circuit board 50, e.g. sensors or antennas, the edge connector 1, into which a mating connector (not shown) can be plugged in a plug-in direction 6, is arranged on the top side 51 of the printed circuit board 50 in the region of the edge 53. The plug-in direction 6 is aligned parallel to the top side 51 of the printed circuit board 50 and a longitudinal axis X and is identified in FIGS. 1 and 2 by means of an arrow. The plug-in direction 6 corresponds to the relative movement of the edge connector 1 when the mating connector is inserted into a mating plug recess 35.

In the region of the edge connector 1, a slot 55 is sawn, machined or molded into the printed circuit board 50, into which the edge connector 1—as will be explained in detail below—protrudes in some regions, in order to achieve the most compact possible design of the printed circuit board assembly 2. The slot 55 protrudes in an approximately rectangular shape or U-shape in the plug-in direction 6 from the edge 53 into the printed circuit board 50.

As can be seen in particular from FIG. 2, the edge connector 1 comprises a two-part housing 10 with a first housing part 20 and a second housing part 30. The housing 10 has a bottom side, a top side, a rear side, a connection side and two end sides.

The first housing part 20 is made of an electrically conductive material, in particular a metal, while the second housing part 30 is made of an electrically insulating material, in particular plastic. The second housing part 30 has, on the side facing the connection side in the plug-in direction 6, a through opening which is designed as a mating plug recess 35 for receiving a mating connector (not shown) and, as can be seen in the perspective view in FIG. 1, is designed to specify the orientation of the mating connector.

The housing 10 or the bottom side of the housing 10 can be divided into a first region 12 and a second region 14, the bottom side of the housing 10 being formed in the first plane 11 in the first region and resting on the top side 51 of the printed circuit board 50. In the second region 14, the bottom side of the housing 10 is arranged in an assembly direction 5 at a distance from the first region 12 in the second plane 13, penetrates the slot 55, and protrudes from the bottom side 52 of the printed circuit board 50. The assembly direction 5 is aligned perpendicular to the printed circuit board 50 or its top side 51, the direction pointing from the top side 51 to the bottom side 52.

In the second region 14, the housing 10 is designed substantially symmetrically in a longitudinal axis parallel to the plug-in direction 6, and the second housing part 30 surrounds the first housing part 20.

The multiple edge connector 1 comprises at least one conductor 15. The at least one conductor 15 is designed to transmit electrical signals, in particular high-frequency electrical signals, from corresponding contacts (not shown) of a mating connector to the corresponding conductor track 54 of the printed circuit board 50. In the exemplary embodiment shown, the multiple edge connector 1 comprises four conductors 15, which are each arranged parallel to one another and spaced apart in two rows, namely a first row and a second row. Alternative configurations of an edge connector according to the invention comprise one, two, three, four, five, six and more conductors 15, the multiple edge connector preferably comprising an even number of conductors 15.

Each conductor 15 comprises a first limb 16 and a second limb 18, the first limb 16 having a first end 17 and the second limb 18 having a second end 19 of each conductor 15. In the exemplary embodiment shown, the conductors 15 are L-shaped, so that the first limb 16 is oriented perpendicular to the second limb 18.

As can be seen from FIG. 2, the first limb 16 is oriented perpendicular to the top side 51 of the printed circuit board 50 and the first end 17 of the conductor 15 protrudes from the first housing part 20 in an assembly direction 5. The freely protruding first end 17 of the conductor 15 penetrates a through hole 56 in the printed circuit board 50 when the edge connector 1 is mounted on the printed circuit board 50 in order to establish an electrical connection with the conductor tracks 54 arranged on the bottom side 52. The alignment of the through holes 56 in the printed circuit board 50 specifies the assembly direction 5, in which the free first ends 17 of the conductors 15 must be inserted into the printed circuit board for assembly purposes.

The first housing part 20 comprises a recess 25, which receives the conductors 15, and in which the conductors 15 are held in an electrically insulated manner. The recess 25 is molded or machined into the first housing part 20 from the rear side of the housing 10 in the plug-in direction 6 and is closed with a third housing part 40 after the edge connector 1 has been mounted.

In addition, the first housing part 20 comprises a through hole 26 for each conductor 15 which are spaced apart from one another and penetrate the first housing part 20, parallel to the longitudinal axis X. The second limb 18 of each conductor 15 is supported in the through hole 26 by means of a dielectric 27, a sleeve-shaped outer conductor 24 being arranged between the outer wall of the through hole 26 and the dielectric 27, which outer conductor is aligned coaxially with the second limb 18 and, together with the second end 19 of the conductor 15, protrudes in the plug-in direction 6 into the mating plug recess 35 of the second housing part 30.

The conductors 15, or their second limbs 18, are spaced parallel to one another in the first row and the second row and are arranged parallel to the top side 51 of the printed circuit board 50. The first row is arranged directly adjacent to the top side 51 or the first plane 11.

In order to achieve the lowest possible overall height of the printed circuit board assembly 2 together with the edge connector 1, the conductor 15 in the first row is arranged as far as possible in the first plane 11, as shown in FIG. 2. In order to maintain the required minimum distance between the second limb 18 and the printed circuit board 50, this second limb 18 of the conductor 15 lies on the first plane 11 and protrudes in the plug-in direction 6 into the mating plug recess 35 of the second housing part 30. The sleeve-shaped outer conductor 24 assigned to this conductor 15 protrudes in some regions into the slot 55 and intersects the first plane 11, a particularly large proportion of the one sleeve-shaped outer conductor 24 particularly preferably being arranged between the first plane 11 and the second plane 13.

The sleeve-shaped outer conductors 24 are electrically connected to the first housing part 20, and for this purpose are firmly inserted in the through hole 26 of the first housing part 20. Accordingly, the second housing part 30, which is made of an electrically conductive material, also forms part of the outer conductor, and can also be connected to a conductor track 55 on the bottom side 52 of the printed circuit board by taking appropriate precautions.

In order to achieve the best possible electrical contacts between the mating connector (not shown) and the conductors 15 and the sleeve-shaped outer conductors 24, the conductors 15 and/or the outer conductors 24 can be made of a precious metal, in particular silver or gold, or have a coating with such a precious metal. It is also advantageous if the sleeve-shaped outer conductor 24 projects beyond each conductor 15 in the plug-in direction 6.

The mating plug recess 35 can be designed to center the mating connector when it is transferred to the mated state, thereby avoiding an angular offset between the contacts of the mating connector and the second end of each conductor 15 and the outer conductor 24.

Thus, according to the invention, an edge connector 1 and a printed circuit board assembly 2 are made available, which enable the simultaneous connection of a plurality of conductors 15 to a corresponding mating connector, and at the same time have the lowest possible height, whereby the space available for a printed circuit board assembly 2 is used as efficiently as possible. Furthermore, the occurrence of passive intermodulation in the edge connector 1 is reduced to the lowest possible level by avoiding metal-to-metal contacts, and the best possible shielding of the conductors 15 against electrical and/or electromagnetic fields is ensured.

LIST OF REFERENCE NUMERALS

1 Connector
2 Printed circuit board assembly
5 Assembly direction
6 Plug-in direction
Housing
11 First plane
12 First region
13 Second plane
14 Second region
Conductor
16 First limb
17 First end
18 Second limb
19 Second end
First housing part
24 Outer conductor
25 Recess
26 Through hole
27 Dielectric
30 Second housing part
31 Shoulder
35 Mating plug recess
40 Third housing part
50 Printed circuit board
51 Top side
52 Bottom side
53 Edge
54 Conductor track
55 Slot

The invention claimed is:

1. An edge connector (1) for a printed circuit board (50) comprising:
   an at least two-part housing (10) with a first housing part (20) and a second housing part (30),
   wherein the first housing part (20) has a recess (25), in which at least one conductor (15) is arranged,
   wherein the at least one conductor (15) has a first limb (16) with a first end (17) and a second limb (18) with a second end (19),
   wherein the housing (10) comprises a first region (12) in a first plane (11), into which each first end (17) protrudes in an assembly direction (5) out of the housing (10) for connection to a conductor track (54) of the printed circuit board (50),
   wherein the housing (10) comprises a second region (14) in a second plane (13), which is arranged in the assembly direction (5) parallel and at a distance from the first plane (11),
   wherein the second limb (18) is arranged at an angle of 90° to the first limb (16), and the second limb (18) protrudes into a mating plug recess (35) in the second housing part (30) in a plug-in direction (6).

2. The edge connector (1) according to claim 1, characterized in that the first housing part (20) is firmly connected to the second housing part (30), and that the second housing part (30) is made of a non-electrically conductive material, in particular plastic.

3. The edge connector (1) according to claim 1, characterized in that the first housing part (20) is made of an electrically conductive material.

4. The edge connector (1) according to claim 1, characterized in that the edge connector (1) is designed as a multiple edge connector (1) and has at least two conductors (15), which are spaced apart from one another.

5. The edge connector (1) according to claim 4, characterized in that the at least two conductors (15) are arranged in at least two rows parallel to the first plane (11).

6. The edge connector (1) according to claim 1, characterized in that the first housing part (20) and/or the second housing part (30) form(s) the second region (14) in the second plane (13).

7. The edge connector (1) according to claim 1, characterized in that the second housing part (30) encloses the first housing part (20) in the second region (14) transversely to the plug-in direction (6).

8. The edge connector (1) according to claim 1, characterized in that the recess (25) in the first housing part (20) in the plug-in direction (6) has a through hole (26) for each conductor (15), through which the second limb (18) of each conductor (15) is guided, and that each conductor is supported with a dielectric (27) on the first housing part (20) in the region of the through hole (26).

9. The edge connector (1) according to claim 1, characterized in that the second end (19) of each conductor (15) is designed as a coaxial connector, and that a sleeve-shaped outer conductor (24) is formed around the second end (19) of each conductor (15).

10. The edge connector (1) according to claim 1, characterized in that the sleeve-shaped outer conductor (24) is electrically connected to the housing (10).

11. The edge connector (1) according to claim 6, characterized in that at least one outer conductor (24) is arranged in regions between the first plane (11) and the second plane (13).

12. The edge connector (1) according to claim 1, characterized in that the second housing part (30) comprises shoulders (31), which protrude perpendicular to the plug-in direction (6) in the first plane (11) and are set up to lie on the printed circuit board (50).

13. The edge connector (1) according to claim 1, characterized in that the first housing part (20) and the second housing part (30) are connected to one another in a form-fitting manner.

14. The edge connector (1) according to claim 1, characterized in that the first limb (16) of each conductor (15) stands freely in the recess (25) of the first housing part (20).

15. The edge connector (1) according to claim 1, characterized in that a third housing part (40) is provided, which closes the recess (25) of the second housing part (20).

16. A printed circuit board assembly (2) with at least one edge connector (1) according to claim 1, characterized in that the printed circuit board (50) comprises a slot (55), that the first region (12) of the housing is arranged on the printed circuit board (50), and that the second region (14) of the housing (10) protrudes into the slot (55).

17. The printed circuit board assembly (2) according to claim 12, characterized in that the shoulders (31) in the plug-in direction (6) lie adjacent to the slot (55) in the first plane (11) on the printed circuit board (50).

* * * * *